United States Patent
Huang

(10) Patent No.: US 11,302,752 B2
(45) Date of Patent: Apr. 12, 2022

(54) DISPLAY PANEL AND DISPLAY APPARATUS FOR EMITTING WHITE LIGHT IN SCREEN-OFF STATE

(71) Applicant: BOE Technology Group Co., Ltd., Beijing (CN)

(72) Inventor: Shuo Huang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 3 days.

(21) Appl. No.: 16/916,138

(22) Filed: Jun. 30, 2020

(65) Prior Publication Data
US 2021/0066404 A1     Mar. 4, 2021

(30) Foreign Application Priority Data
Aug. 29, 2019    (CN) .......................... 201910820605.8

(51) Int. Cl.
*H01L 27/32*      (2006.01)
*H01L 51/52*      (2006.01)

(52) U.S. Cl.
CPC ...... *H01L 27/3218* (2013.01); *H01L 27/3211* (2013.01); *H01L 27/3216* (2013.01); *H01L 27/3246* (2013.01); *H01L 27/3272* (2013.01); *H01L 51/5253* (2013.01)

(58) Field of Classification Search
CPC ............. H01L 27/3218; H01L 27/3211; H01L 27/3216; H01L 27/3246; H01L 27/3272; H01L 51/5253
USPC ........................................ 257/40; 438/82, 99
See application file for complete search history.

(56) References Cited

U.S. PATENT DOCUMENTS

| | | | |
|---|---|---|---|
| 6,628,355 B1 * | 9/2003 | Takahara | G09G 3/3648 349/106 |
| 2006/0033860 A1 * | 2/2006 | Okishiro | G02F 1/133609 349/70 |
| 2016/0276421 A1 | 9/2016 | Lee et al. | |
| 2017/0061904 A1 * | 3/2017 | Lin | H05B 45/60 |
| 2017/0269435 A1 | 9/2017 | Yoon et al. | |
| 2017/0271415 A1 | 9/2017 | Yamazaki | |
| 2019/0212612 A1 | 7/2019 | Li | |
| 2019/0267443 A1 | 8/2019 | Motoyama et al. | |
| 2020/0227486 A1 | 7/2020 | Liu et al. | |

FOREIGN PATENT DOCUMENTS

| | | |
|---|---|---|
| CN | 103094307 A | 5/2013 |
| CN | 108987451 A | 12/2018 |
| CN | 109713018 A | 5/2019 |
| CN | 110010664 A | 7/2019 |

OTHER PUBLICATIONS

Office Action dated May 20, 2021 for Chinese Patent Application No. 201910820605.8 and English Translation.

* cited by examiner

*Primary Examiner* — Didarul A Mazumder
(74) *Attorney, Agent, or Firm* — Ling Wu; Stephen Yang; Ling and Yang Intellectual Property

(57) ABSTRACT

Provided are a display panel and a display apparatus. The display panel includes: a substrate and a plurality of light filters of different colors disposed on the substrate, the light filter including a plurality of sub-light filters arranged in an array, so that when the display panel is in a screen-off state, light emitted from the light filters of different colors is mixed to form white light.

19 Claims, 2 Drawing Sheets

DISPLAY PANEL AND DISPLAY APPARATUS FOR EMITTING WHITE LIGHT IN SCREEN-OFF STATE

CROSS-REFERENCE TO RELATED APPLICATION

This application claims the priority of Chinese Patent Application No. 201910820605.8 filed to the CNIPA on Aug. 29, 2019, the content of which is hereby incorporated by reference.

TECHNICAL FIELD

The present disclosure relates to, but is not limited to, the field of display technology, in particular to a display panel and a display apparatus.

BACKGROUND

Organic Light-Emitting Diode (OLED) display panels have many advantages such as self-luminescence, ultra-thinness, fast response, high contrast, and wide viewing angle, and are a kind of display panels that have received extensive attention at present.

An OLED display panel is generally provided with a light filter encapsulated on a light emitting side of an OLED display substrate. Since the light filter can filter light, after the ambient light entering the OLED display panel is reflected by an internal structure of the OLED display panel, the amount of light emitted from the light emitting side can be reduced.

SUMMARY

The following is a summary of the subject matter described in detail in the present disclosure. This summary is not intended to limit the scope of protection of the claims.

In a first aspect, the present disclosure provides a display panel, including: a substrate and a plurality of light filters of different colors disposed on the substrate; the light filter including a plurality of sub-light filters arranged in an array, so that when the display panel is in a screen-off state, light emitted from the light filters of different colors is mixed to form white light.

In some possible implementations, the display panel further includes: a plurality of gate lines and a plurality of data lines disposed on the substrate; the sub-light filter includes: a first edge extending in a first direction, and a second edge and a third edge which extend in a second direction and are opposite to each other, and a length of the second edge in the second direction is less than or equal to a length of the third edge in the second direction; wherein the first direction is a data line arrangement direction and the second direction is a gate line arrangement direction.

In some possible implementations, lengths of first edges of all sub-light filters of light filters of the same color in the first direction are equal.

In some possible implementations, lengths of second edges of all sub-light filters of light filters of the same color in the second direction are equal.

In some possible implementations, an absolute value of a difference between the length of first edges of all sub-light filters of light filters of the same color in the first direction and the length of second edges of all sub-light filters of the light filters of the same color in the second direction is less than or equal to a threshold difference.

In some possible implementations, lengths of first edges of sub-light filters of light filters of different colors in the first direction are equal.

In some possible implementations, lengths of second edges of sub-light filters of light filters of different colors in the second direction are equal.

In some possible implementations, the light filters include: a light filter of a first color, a light filter of a second color, and a light filter of a third color; an area of the light filter of the first color is greater than or equal to a first threshold area, an area of the light filter of the second color is greater than or equal to a second threshold area, and an area of the light filter of the third color is greater than or equal to a third threshold area; the first color, the second color and the third color are respectively one of red, blue and green, and the three colors are different from each other.

In some possible implementations, the first threshold area is not equal to the second threshold area, and the second threshold area is not equal to the third threshold area.

In some possible implementations, the sub-light filter has a polygonal shape.

In some possible implementations, the display panel further includes: a black matrix layer provided on the same layer as the light filters, and an area between adjacent sub-light filters is a spacing area; an orthographic projection of the black matrix layer on the substrate covers an orthographic projection of the spacing area on the substrate.

In some possible implementations, a plurality of sub-light filters of light filters of different colors have different arrangements.

In some possible implementations, the display panel further includes: a driving structure layer provided on the substrate; the driving structure layer is provided on one side of the light filter close to the substrate.

In some possible implementations, the display panel further includes: a pixel definition layer and a light emitting structure layer provided on the substrate; the pixel definition layer and the light emitting structure layer are provided on one side of the driving structure layer close to the light filter, and the light emitting structure layer is connected to the driving structure layer.

In some possible implementations, the light emitting structure layer includes: a first electrode, an organic light emitting layer, and a second electrode; the first electrode is located on one side, close to the substrate, of the organic light emitting layer, the second electrode is located on one side, away from the substrate, of the organic light emitting layer, and the first electrode is connected to the driving structure layer.

In some possible implementations, the pixel definition layer is provided with an opening area; the first electrode and the organic light emitting layer are provided in the opening area of the pixel definition layer, and an orthographic projection of the second electrode on the substrate at least partially overlaps an orthographic projection of the pixel definition layer on the substrate.

In some possible implementations, an orthographic projection of the light filter on the substrate at least partially overlaps an orthographic projection of the opening area of the pixel definition layer on the substrate.

In some possible implementations, the first electrode is a reflective electrode.

In some possible implementations, the display panel further includes: an encapsulation layer; the encapsulation layer is provided on one side, close to the light emitting structure layer, of the light filter.

In a second aspect, the present disclosure further provides a display apparatus, including the display panel.

Other aspects will become apparent upon reading and understanding the drawings and detailed description.

BRIEF DESCRIPTION OF DRAWINGS

The accompanying drawings are used to provide an understanding of the technical solutions of the present disclosure and form a part of the specification. Together with the embodiments of the present disclosure, they are used to explain the technical solutions of the present disclosure and do not constitute a limitation on the technical solutions of the present disclosure.

DETAILED DESCRIPTION

Figure 1:
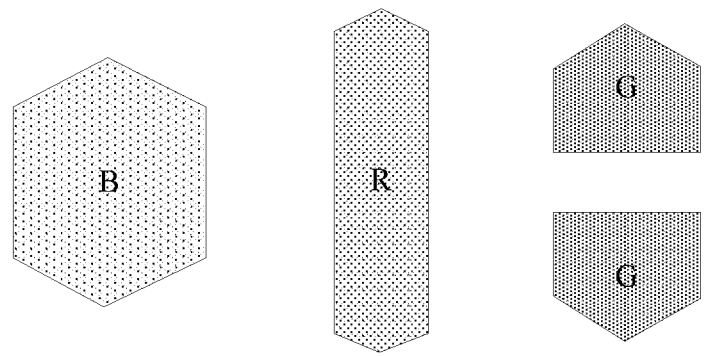
FIG. 1 is a top view of light filters of different colors in a display panel.

The embodiments of the present disclosure will be described below in detail with reference to the accompanying drawings. The embodiments of the present disclosure and the features of the embodiments may be combined with each other arbitrarily if there is no conflict.

A plurality of embodiments are described in the present disclosure, but the description is exemplary rather than limiting, and for those of ordinary skills in the art, there may be more embodiments and implementation solutions within the scope of the embodiments described in the present disclosure. Although many possible combinations of features are shown in the drawings and discussed in the Detailed Description, many other combinations of the disclosed features are also possible. Unless specifically limited, any feature or element of any embodiment may be used in combination with or in place of any other feature or element of any other embodiment.

The present disclosure includes and contemplates combinations with features and elements known to those of ordinary skills in the art. Embodiments, features and elements already disclosed in this disclosure may also be combined with any conventional features or elements to form a technical solution defined by the claims. Any feature or element of any embodiment may also be combined with features or elements from other technical solutions to form another technical solution defined by the claims. Therefore, it should be understood that any of the features shown and discussed in the present disclosure may be implemented individually or in any suitable combination. Therefore, the embodiments are not otherwise limited except in accordance with the appended claims and equivalents thereof. In addition, various modifications and changes can be made within the scope of protection of the appended claims.

Unless otherwise defined, technical terms or scientific terms used in the present disclosure shall have common meanings as construed by those of ordinary skills in the art to which the present disclosure pertains. The wordings "first", "second" and the like used in the present disclosure do not represent any order, quantity or importance, but are merely used to distinguish among different components. Similar terms such as "include" or "contain" mean that an element or item appearing before the terms covers an element or item and its equivalents listed after the terms, without excluding other elements or items. Similar terms such as "connect" or "link" are not limited to physical or mechanical connections, but may include electrical connections, whether direct or indirect. "Up", "down", "left", "right", etc. are only used to represent a relative position relationship that may change accordingly when an absolute position of an object being described changes.

Taking a pixel arrangement GGRB used in a display panel as an example, since the sizes of a red sub-pixel R, a blue sub-pixel B and a green sub-pixel G are different, the sizes of the light filters corresponding to respective sub-pixels are also different. FIG. 1 is a top view of light filters of different colors in a display panel. As shown in FIG. 1, the light filter corresponding to the green sub-pixel G has the smallest length in a vertical direction, and the light filter corresponding to the red sub-pixel R has the smallest length in a horizontal direction. When an OLED display panel is in a screen-off state, after external light is reflected by an internal structure of the OLED display panel, a diffraction phenomenon will occur when the reflected light is emitted from the light filter, and the edge of the light filter with the minimum length has a stronger diffraction effect, then a color separation phenomenon will occur on the OLED display panel, which seriously affects the user's viewing experience and reduces the reliability of the OLED display panel.

Figure 2:
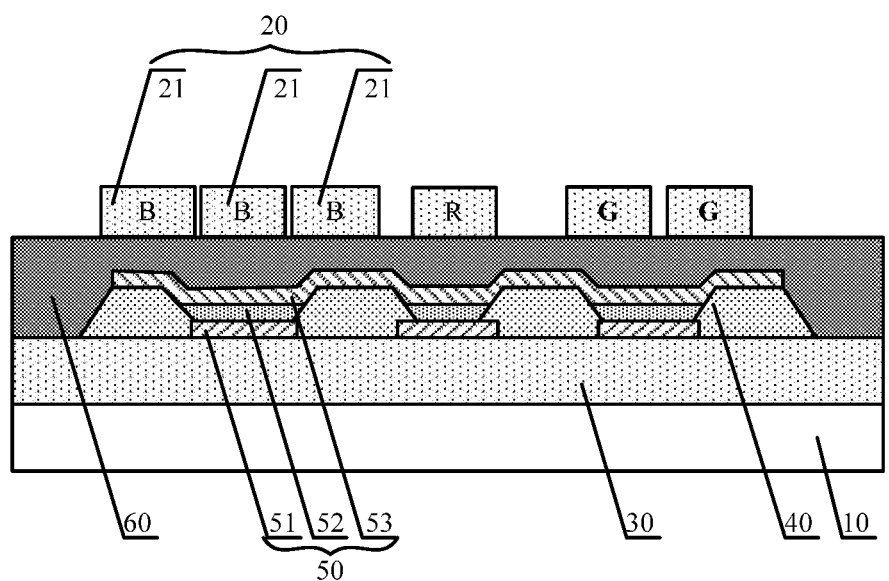
FIG. 2 is a schematic structural view of a display panel according to an embodiment of the present disclosure.
Figure 3:
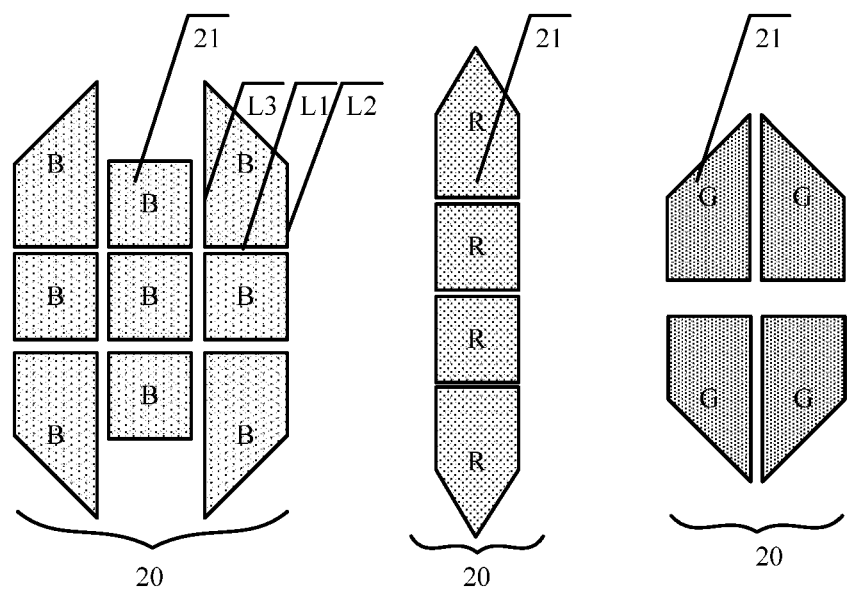
FIG. 3 is a top view of light filters of different colors according to an embodiment of the present disclosure.

FIG. 2 is a schematic structural view of a display panel according to an embodiment of the present disclosure, and FIG. 3 is a top view of light filters of different colors according to an embodiment of the present disclosure. As shown in FIGS. 2 and 3, the display panel according to an embodiment of the present disclosure includes: a substrate 10 and a plurality of light filters 20 of different colors disposed on the substrate 10.

The light filter 20 includes: a plurality of sub-light filters 21 arranged in an array, so that when the display panel is in a screen-off state, light emitted from the light filters 20 of different colors is mixed to form white light.

In an exemplary embodiment, the substrate 10 may be a rigid substrate or a flexible substrate. The rigid substrate may be, but is not limited to, one or more of glass and metal foils. The flexible substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers.

The display panel being in a screen-off state means that the display panel itself does not emit light. Light emitted from light filters of different colors comes from light reflected by an interior of the display panel.

The display panel includes a plurality of pixel regions, each including a plurality of sub-pixels. Each sub-pixel corresponds to one light filter. The light filter corresponding to a red sub-pixel is a red light filter R, the light filter corresponding to a blue sub-pixel is a blue light filter B, and the light filter corresponding to a green sub-pixel is a green light filter G.

In an exemplary embodiment, the pixel structure of the display panel may be an RGB pixel structure, an RGBW pixel structure, or a GGRB pixel structure. FIG. 3 illustrates a GGRB pixel structure as an example.

In this embodiment, on the one hand, the light filter can filter the emitted light to improve the color purity of the emitted light; and on the other hand, the light filter can filter external light, reduce ambient light entering the display panel, and reduce the reflection of the display panel for ambient light, which improves the user experience.

The display panel according to an embodiment of the present disclosure includes: a substrate and a plurality of light filters of different colors disposed on the substrate. The light filter includes: a plurality of sub-light filters arranged in an array, so that when the display panel is in a screen-off state, light emitted from the light filters of different colors is mixed to form white light. In the present disclosure, by providing a plurality of light filters arranged in an array, when the display panel is in a screen-off state, light emitted from the light filters of different colors is mixed to form white light, which eliminates a color separation phenomenon when the display panel is in a screen-off state, and improves reliability of the display panel.

As shown in FIG. 2, a display panel according to an exemplary embodiment further includes a driving structure layer 30 disposed on the substrate 10. The driving structure layer 30 is disposed on a side, close to the substrate 10, of the light filter 20.

In an exemplary embodiment, the driving structure layer 30 includes a transistor. A plurality of transistors may constitute a pixel driving circuit.

In an exemplary embodiment, the structure of the transistor may be a top gate structure or may be a bottom gate structure.

As shown in FIG. 2, a display panel according to an exemplary embodiment further includes: a pixel definition layer 40 and a light emitting structure layer 50. The pixel definition layer 40 and the light emitting structure layer 50 are disposed on a side, close to the light filter 20, of the driving structure layer 30. The driving structure layer 30 is connected to the light emitting structure layer 50.

In an exemplary embodiment, the pixel definition layer 40 is configured to define sub-pixels. The fabrication material of the pixel definition layer may be a resin material or may be photoresist.

As shown in FIG. 2, a light emitting structure layer 50 of a display substrate according to an exemplary embodiment includes a first electrode 51, a second electrode 53, and an organic light emitting layer 52. The first electrode 51 is disposed on a side, close to the substrate 10, of the organic light emitting layer 52, and the second electrode 53 is disposed on a side, away from the substrate 10, of the organic light emitting layer 52.

As shown in FIG. 2, a pixel definition layer 40 of a display substrate according to an exemplary embodiment is provided with an opening area. The first electrode 51 and the organic light emitting layer 52 are disposed in the opening area of the pixel definition layer 40. An orthographic projection of the second electrode 53 on the substrate 10 at least partially overlaps an orthographic projection of the pixel definition layer 40 on the substrate 10.

An orthographic projection of the light filter 20 on the substrate 10 at least partially overlaps an orthographic projection of the opening area of the pixel definition layer 40 on the substrate 10, which can ensure the display effect of the display panel.

In an exemplary embodiment, the first electrode 51 may be a reflective electrode. The first electrode is configured to reflect ambient light into the display panel to the outside, when the display panel is in a dark state.

In an exemplary embodiment, the fabrication material of the first electrode 51 may be a metal, such as aluminum, copper, or other metal materials.

In an exemplary embodiment, the light emitting structure layer 50 includes a plurality of light emitting elements.

In an exemplary embodiment, the light emitting element may be an OLED or may be a Quantum Dot Light Emitting Diode (QLED).

As shown in FIG. 2, a display panel according to an exemplary embodiment further includes an encapsulation layer 60. The encapsulation layer 60 is disposed on one side, close to the light filter 20, of the light emitting structure layer 50.

The encapsulation layer 60 can isolate the light emitting structure layer from the outside, preventing water and oxygen from entering the organic light emitting layer of the light emitting structure layer of the display panel to affect the service life of the display panel. In addition, an outer surface of the encapsulation layer is flat, which can improve the display effect of the display panel.

As shown in FIG. 3, a display panel according to an exemplary embodiment further includes a plurality of gate lines and a plurality of data lines (not shown) disposed on the substrate 10.

The sub-light filter 21 includes: a first edge L1 extending in a first direction, and a second edge L2 and a third edge L3 which extend in a second direction and are opposite to each other, and a length of the second edge L2 in the second direction is less than or equal to a length of the third edge L3 in the second direction. The first direction is a data line arrangement direction and the second direction is a gate line arrangement direction.

In an exemplary embodiment, the first direction and the second direction are perpendicular to each other, and a plane where the first direction and the second direction lie is a plane where the display panel lies.

The first edge L1 is the shortest edge of the sub-light filter extending in the first direction, and the second edge L2 is the shortest edge of the sub-light filter extending in the second direction.

In an exemplary embodiment, lengths of first edges of all sub-light filters 21 of light filters 20 of the same color in the first direction are equal, so that light emitted from the light filters can be uniformly distributed.

In an exemplary embodiment, lengths of second edges of all sub-light filters 21 of light filters 20 of the same color in the second direction are equal, so that light emitted from the light filters can be uniformly distributed.

In an exemplary embodiment, an absolute value of a difference between the length of first edges of all sub-light filters 21 of light filters 20 of the same color in the first direction and the length of second edges of all sub-light filters 21 of light filters 20 of the same color in the second direction is less than or equal to a threshold difference, so that light emitted from the light filters can be uniformly distributed. The smaller the absolute value of the difference between the length of the first edges of all sub-light filters 21 in the first direction and the length of the second edges of all sub-light filters 21 in the second direction is, the more uniform the light emitted from the light filters is.

In an exemplary embodiment, the threshold difference may be 0.

In an exemplary embodiment, lengths of first edges of sub-light filters 21 of light filters 20 of different colors in the first direction are equal, which can ensure that light emitted from the light filters of different colors are diffracted with the same intensity, so that the diffracted light can be mixed to form white light, and the color separation phenomenon is eliminated.

In an exemplary embodiment, lengths of second edges of sub-light filters 21 of light filters 20 of different colors in the second direction are equal, which can ensure that light emitted from the light filters of different colors are diffracted with the same intensity, so that the diffracted light can be mixed to form white light, and the color separation phenomenon is eliminated.

In an exemplary embodiment, the light filters include a light filter of a first color, a light filter of a second color, and a light filter of a third color. The area of the light filter of the first color is greater than or equal to a first threshold area, the area of the light filter of the second color is greater than or equal to a second threshold area, and the area of the light filter of the third color is greater than or equal to a third threshold area.

By configuring the light filter of the first color to have an area greater than or equal to the first threshold area, the light filter of the second color to have an area greater than or equal to the second threshold area, and the light filter of the third color to have an area greater than or equal to the third threshold area, the transmittance of the light filters will not be reduced, and the power consumption of the display panel will not be increased.

In an exemplary embodiment, the first color, the second color and the third color are one of red, blue and green, respectively, and the three colors are different from each other.

In an exemplary embodiment, the first threshold area is not equal to the second threshold area, and the second threshold area is not equal to the third threshold area.

In an exemplary embodiment, a plurality of sub-light filters included in the light filters are disposed in the first direction and the second direction, which can improve the angle of view of the display panel. With the transmittance of the display panel being ensured, the color separation phenomenon is eliminated, and the angle of view is also improved.

As shown in FIG. 3, in an exemplary embodiment, a plurality of sub-light filters 21 of light filters 20 of different colors have different arrangements. The arrangement of sub-light filters 21 can be determined according to the area of the light filter and process requirements.

In an exemplary embodiment, the sub-light filter may have a polygonal shape, which can be a square or trapezoid.

Figure 4:
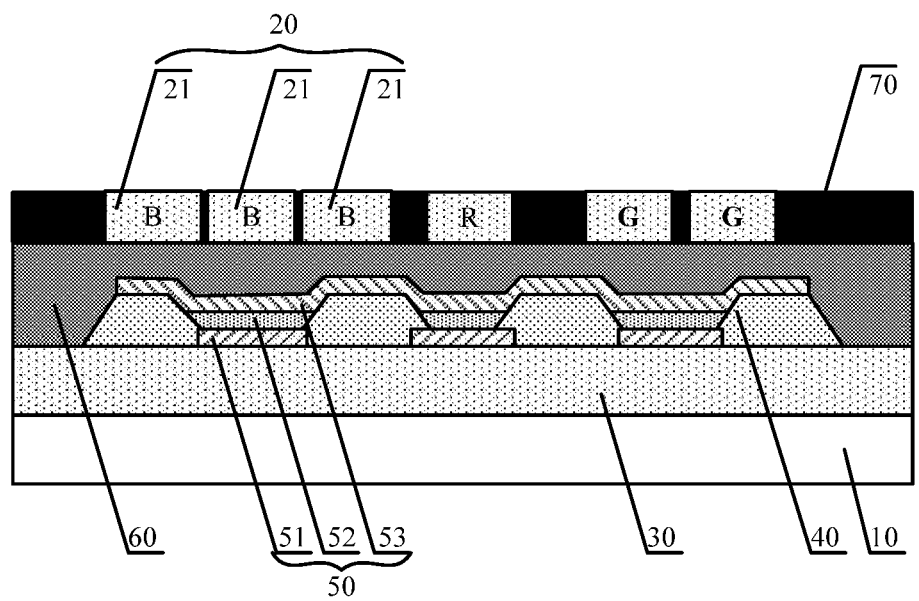
FIG. 4 is a schematic structural view of a display panel according to an exemplary embodiment.

FIG. 4 is a schematic structural view of a display panel according to an exemplary embodiment. As shown in FIG. 4, a display panel according to an exemplary embodiment further includes: a black matrix layer 70 disposed on the same layer as the light filters 20, an area between adjacent sub-light filters 21 being a spacing area; and an orthographic projection of the black matrix layer 70 on the substrate 10 covering an orthographic projection of the spacing area on the substrate 10.

In an exemplary embodiment, intervals between adjacent sub-light filters may be equal or may not be equal.

Providing a black matrix layer in the spacing area can ensure the light emitting effect of the display panel and improve the reliability of the display panel.

In an exemplary embodiment, the display panel further includes a protective layer (not shown) provided on a side, away from the substrate 10, of the light filter.

In an exemplary embodiment, the protective layer may be made of a resin material.

The protective layer can fix and protect the black matrix layer and the light filters, can ensure the display effect of the display panel and improve the reliability of the display panel.

An embodiment of the present disclosure further provides a display apparatus, including a display panel.

In an exemplary embodiment, the display apparatus may be electronic paper, a mobile phone, a tablet computer, a television, a display, a notebook computer, a digital photo frame or a navigator.

The display panel is the display panel according to any one of the previous embodiments, and the display panels are similar in implementation principle and effect, which will not be described further here.

The drawings in the present disclosure only refer to the structures involved in the embodiments of the present disclosure, and as to other structures, reference may be made to general designs.

For the sake of clarity, the thickness and size of layers or microstructures are exaggerated in the drawings used to describe the embodiments of the present disclosure. It will be understood that when an element such as a layer, film, region or substrate is referred to as being "on" or "under" another element, the element may be "directly" "on" or "under" the another element, or there may be an intervening element.

Although the embodiments disclosed in the present disclosure are as described above, the described contents are only the embodiments for facilitating understanding of the present disclosure, which are not intended to limit the present disclosure. Any person skilled in the art to which the present disclosure pertains can make any modifications and variations in the form and details of implementation without departing from the spirit and scope of the present disclosure. Nevertheless, the scope of patent protection of the present disclosure shall still be determined by the scope as defined by the appended claims.

What I claim is:

1. A display panel, comprising:
    a substrate and a plurality of light filters of different colors disposed on the substrate;
    a light filter comprising a plurality of sub-light filters arranged in an array to enable light emitted from the light filter of different colors to mix to form white light when the display panel is in a screen-off state;
    wherein the display panel further comprises: a plurality of gate lines and a plurality of data lines disposed on the substrate;
    a sub-light filter comprises: a first edge extending in a first direction, and a second edge and a third edge extending in a second direction and opposite to each other, wherein a length of the second edge in the second direction is less than or equal to a length of the third edge in the second direction;
    wherein the first direction is a data line arrangement direction and the second direction is a gate line arrangement direction.

2. The display panel according to claim 1, wherein a length of the first edge of all sub-light filters of the light filter of the same color in the first direction are equal.

3. The display panel according to claim 2, wherein a length of the second edge of all sub-light filters of the light filter of the same color in the second direction are equal.

4. The display panel according to claim 3, wherein an absolute value of a difference between the length of the first edge of all sub-light filters of the light filter of the same color in the first direction and the length of the second edge of all sub-light filters of the light filters of the same color in the second direction is less than or equal to a threshold difference.

5. The display panel according to claim 1, wherein a length of the first edge of sub-light filters of the light filter of different colors in the first direction are equal.

6. The display panel according to claim 5, wherein a length of the second edge of sub-light filters of the light filter of different colors in the second direction are equal.

7. The display panel according to claim 1, wherein the light filter comprises: a light filter of a first color, a light filter of a second color, and a light filter of a third color;
an area of the light filter of the first color is greater than or equal to a first threshold area, an area of the light filter of the second color is greater than or equal to a second threshold area, and an area of the light filter of the third color is greater than or equal to a third threshold area;
the first color, the second color and the third color are respectively one of red, blue and green, and the three colors are different from each other.

8. The display panel according to claim 1, wherein the first threshold area is not equal to the second threshold area, and the second threshold area is not equal to the third threshold area.

9. The display panel according to claim 1, wherein a sub-light filter of the plurality of sub-light filters has a polygonal shape.

10. The display panel according to claim 1, wherein the display panel further comprises a black matrix layer provided on the same layer as the light filter; an area between adjacent sub-light filters is a spacing area;
an orthographic projection of the black matrix layer on the substrate covers an orthographic projection of the spacing area on the substrate.

11. The display panel according to claim 1, wherein the plurality of sub-light filters of the light filter of different colors have different arrangements.

12. The display panel according to claim 1, wherein the display panel further comprises: a driving structure layer provided on the substrate;
wherein the driving structure layer is provided on one side, close to the substrate.

13. The display panel according to claim 12, wherein the display panel further comprises: a pixel definition layer and a light emitting structure layer provided on the substrate;
wherein the pixel definition layer and the light emitting structure layer are provided on one side, close to the light filter of the driving structure layer, and the light emitting structure layer is connected to the driving structure layer.

14. The display panel according to claim 13, wherein the light emitting structure layer comprises: a first electrode, an organic light emitting layer, and a second electrode;
wherein the first electrode is located on one side, close to the substrate, the second electrode is located on one side, away from the substrate, and the first electrode is connected to the driving structure layer.

15. The display panel according to claim 14, wherein the pixel definition layer is provided with an opening area;
the first electrode and the organic light emitting layer are provided in the opening area of the pixel definition layer, and an orthographic projection of the second electrode on the substrate at least partially overlaps an orthographic projection of the pixel definition layer on the substrate.

16. The display panel according to claim 15, wherein an orthographic projection of the light filter on the substrate at least partially overlaps an orthographic projection of the opening area of the pixel definition layer on the substrate.

17. The display panel according to claim 14, wherein the first electrode is a reflective electrode.

18. The display panel according to claim 13, wherein the display panel further comprises: an encapsulation layer;
wherein the encapsulation layer is provided on one side, close to the light emitting structure layer.

19. A display apparatus, comprising the display panel according to claim 1.

* * * * *